US006667492B1

(12) United States Patent
Kendall

(10) Patent No.: US 6,667,492 B1
(45) Date of Patent: Dec. 23, 2003

(54) QUANTUM RIDGES AND TIPS

(75) Inventor: Don L. Kendall, 512 Tassy Ct., SE., Albuquerque, NM (US) 87123

(73) Assignee: Don L. Kendall, Albuquerque, NM (US)

( * ) Notice: Subject to any disclaimer, the term of this patent is extended or adjusted under 35 U.S.C. 154(b) by 0 days.

(21) Appl. No.: 09/187,730

(22) Filed: Nov. 9, 1998

Related U.S. Application Data

(60) Provisional application No. 60/065,082, filed on Nov. 10, 1997.

(51) Int. Cl.[7] .............................................. H01L 29/15
(52) U.S. Cl. ........................... 257/30; 257/12; 257/622; 257/628; 438/962
(58) Field of Search ................................ 257/618, 628, 257/9, 12, 30, 622, 627; 438/962

(56) References Cited

U.S. PATENT DOCUMENTS

| | | | | |
|---|---|---|---|---|
| 4,983,540 A | * | 1/1991 | Yamaguchi et al. | ......... 437/110 |
| 4,987,094 A | | 1/1991 | Colas et al. | |
| 5,258,326 A | | 11/1993 | Morishima et al. | |
| 5,296,719 A | | 3/1994 | Hirai et al. | |
| 5,300,452 A | | 4/1994 | Chang et al. | |
| 5,327,675 A | | 7/1994 | Wakabayashi et al. | |
| 5,482,890 A | | 1/1996 | Liu et al. | |
| 5,499,206 A | * | 3/1996 | Muto | ......... 365/114 |
| 5,518,955 A | * | 5/1996 | Goto et al. | ......... 437/133 |
| 5,539,214 A | * | 7/1996 | Lynch et al. | ......... 257/15 |
| 5,567,954 A | | 10/1996 | Dobson et al. | |
| 5,612,255 A | | 3/1997 | Chapple-Sokol et al. | |
| 5,868,952 A | * | 2/1999 | Hatakeyama et al. | ......... 216/66 |

FOREIGN PATENT DOCUMENTS

| JP | 9-63952 | * | 3/1997 | ........... H01L/21/20 |
|---|---|---|---|---|

OTHER PUBLICATIONS

Technical Disclosure Bulletin, "Technique for Producing X Ray Diffraction Gratings," Apr. 1978, vol. 20 Issue No. 11A, pp. 4641–4642.*

Baski et al. A Stable High–Index Surface of Silicon Si(5 5 12), Science, vol. 269, Issue 5230 Sep. 15, 1995, pp. 1556–1560.*

Erwin et al., Structure and Stability of Si (114)–(2×1), Physical Review Letters, vol. 77, No. 4, Jul. 22, 1996, pp. 687–690.*

Jones et al, Noble Metal Growth on Si (5 5 12), Submitted to World Scientific on Feb. 24, 2000.*

Baski et al, STM Studies of 1–D Noble Metal Growth on Silicon, Submitted to Ultramicroscopy (Heidelberg 2000) on Jul. 3, 2000.*

"Far Beyond Microelectronics with Silicon," Don L. Kendall, Univ. of New Mexico, EECE Department and Center for High Technology Materials, Albuquerque, New Mexico 87131, Oct. 30, 1995.

Liu, et al. "Cross–sectional HRTEM study of Si (5 5 12) reconstructed Surface," *Journal of Crystal Growth* Article in Press.

* cited by examiner

*Primary Examiner*—B. William Baumeister
(74) *Attorney, Agent, or Firm*—Jagtiani & Guttag

(57) ABSTRACT

The present invention provides a quantum structure product comprising a substrate having quantum ridges and quantum tips on at least one surface thereof. In some embodiments of the invention quantum ridges may support quantum wires and the quantum tips may support quantum dots. Grooves which separate the quantum ridges and quantum tips from each other may be shallow or deep, and may contain organic molecules, fullerene tubes, and fullerene balls.

115 Claims, 6 Drawing Sheets

QUANTUM RIDGES AND TIPS

RELATED APPLICATION

The present application is based on U.S. Provisional Patent Application No. 60/065,082 filed Nov. 10, 1997, the entire disclosure and contents of which is hereby incorporated by reference.

BACKGROUND OF THE INVENTION

1. Field of the Invention

The present invention relates to nanometer scale structures formed on substrates.

2. Description of the Prior Art

With the decreasing size of integrated circuits (ICs), problems having been encountered in trying to produce narrower and narrower structures in a piece of silicon or other semiconductor material. For example, in order to reduce the minimum size of the structures on integrated circuits by an order of magnitude below their current size of about 2000 Å, it is generally believed that the current methods for producing patterns on semiconductor wafers using optical techniques will have to be abandoned.

One method that has been proposed to create small structures on integrated circuits is to use special masks made by electron beam lithography and then to use X-rays to expose the patterns for the integrated circuits. However, there are severe drawbacks to using X-rays, including the fact that conventional masking materials and photoresists may not be used. More importantly, the minimum geometry that may be produced is probably no better than about 700 Å.

Therefore, there exists a need for a method for forming nanometer sized structures that may be used to greatly reduce power consumption and increase operating speeds of integrated circuits. If those large improvements may be made using current optical lithography in conjunction with a method to form well-controlled nanometer sized structures in critical areas of devices in integrated circuits, then the advantages would be immense.

SUMMARY OF THE INVENTION

It is therefore an object of the present invention to provide useful quantum structures whose smallest meaningful dimensions are about two orders of magnitude smaller than the smallest dimensions now being produced on modern integrated circuits in production.

The resulting structures amount to a radically new kind of material, and as such there are many applications extending from electronics to physics to biology and chemistry. The present invention provides a new form of "atomic lithography" that amplifies the existing surface morphology and crystal structure itself to establish line and space distances. No electromagnetic or charged particle beams need be involved so there are no wavelength considerations. Furthermore, there is no chemical development in the traditional sense, although standard optical lithography may still be used to complete other components integrated circuits or other products.

According to one aspect of the present invention, there is provided a quantum ridge product comprising a substrate having a plurality of substantially parallel quantum ridges on a surface thereof, each pair of adjacent quantum ridges of the plurality quantum ridge having a pitch of 5.4 to 600 Å and being separated by a groove having a width of up to 597 Å and a depth of 4 to 30,000 Å, except ridge pitches from 5.4 to 9.3 Å will support quantum wires but will not support stable grooves to be etched in Silicon (Si). All the ranges refer to Si and must be increased or decreased by up to 30% for other crystals.

According to a second aspect of the present invention, there is provided a quantum ridge product comprising: a substrate having a plurality of substantially parallel quantum ridges on a surface thereof, each pair of adjacent quantum ridges of the plurality quantum ridge having a pitch of 5.4 to 600 Å, and ridges with pitches of 9.4 Å or larger being separated by a groove having a width of up to 597 Å, at least one of the quantum ridges having a quantum wire supported on top of at least one of the quantum ridges and extending in a direction along the length of the quantum ridge, the quantum wire comprising a conductive material having a width of 3 to 594 Å.

According to a third aspect of the present invention, there is provided a quantum tip product comprising a substrate having a plurality of quantum tips on a surface thereof, each of the plurality of quantum tips being separated from an adjacent quantum tip by grooves, each of the grooves having a width of up to 597 Å and a depth of 4 to 30,000 Å.

According to a fourth aspect of the present invention there is provided a quantum tip product comprising a substrate having a plurality of quantum tips on a surface thereof, each of the plurality of quantum tips being separated from adjacent quantum tips by grooves, each of the grooves having a width of up to 597 Å, at least one of the quantum tips having a quantum dot supported on top of at least one quantum tip, the quantum dot comprising a conductive material having a width of 3 to 594 Å.

According to a fifth aspect of the present invention, there is provided a method for making a quantum structure product comprising the steps of: providing a first substrate having a (1 1 X) surface structure and including a plurality of substantially parallel quantum ridges and grooves on a surface thereof, the grooves having a width of up to 597 Å and separating adjacent quantum ridges; and coating the first substrate with a metal to form at least one quantum wire on at least one of the quantum ridges, the at least one quantum wire having a width of 3 to 47 Å.

According to a sixth aspect of the present invention, there is provided a quantum ridge product comprising two quantum ridge substrates bonded to each other, each of the substrates having a plurality of substantially parallel quantum ridges on a surface thereof, each pair of adjacent quantum ridges of the plurality quantum ridge having a pitch of 5.4 to 600 Å and being separated by a groove having a width of up to 597 Å and a depth of 4 to 30,000 Å, the quantum ridge substrates being bonded together at the quantum ridge surface of each substrate.

According to a seventh aspect of the present invention, there is provided a quantum ridge product comprising: a substrate having a plurality of substantially parallel quantum ridges on a surface thereof, each pair of adjacent quantum ridges of the plurality quantum ridges having a pitch of 5.4 to 600 Å and being separated by a groove having a width of up to 597 Å, at least one of the quantum ridges having a quantum dot supported on top of the at least one quantum ridge, the quantum dot comprising a conductive material having a width in at least one direction of 3 to 594 Å.

According to a tenth aspect of the present invention, there is provided a quantum structure product comprising a substrate including a groove having a width of up to 597 Å and a depth of 4 to 30,000 Å.

There are three general ranges for the pitches of the present invention. For the Self Aligned Atomic Shadowing (SALAS) procedure, the range is preferably 5.4 to 54 Å for quantum wires and quantum dots, and is 9.4 to 54 Å for SALAS when grooves are etched or when quantum tips or dots are produced. The range of pitches for the Self Aligned Atomic STEPS (SALASTEPS) is typically 54 to 600 Å. It should be appreciated that there is some overlap between the ranges of SALAS and SALASTEPS. The SALASTEPS pitches and local separations are somewhat variable due to the ragged single layer and double layer atomic steps, but the SALAS ridges are atomically straight and precisely spaced on the (1 1 4) surface of Si. The SALAS ridges on the (5 5 12) and other (1 1 X) surfaces may have restructuring faults, but the ridges are atomically straight over long distances.

BRIEF DESCRIPTION OF THE DRAWINGS

The invention will be described in conjunction with the accompanying drawings, in which.

DETAILED DESCRIPTION OF THE PREFERRED EMBODIMENT

Definitions

Figure 1:
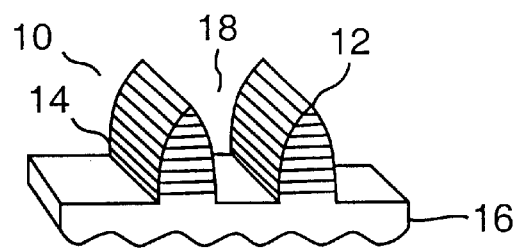
FIG. 1 is a cross-sectional view of a shallow groove quantum-wire quantumridge product of the present invention after oblique evaporation while rotating a substrate supporting these elements.

For the purposes of the present invention, the term "plurality" refers to two or more of a given item. For example, the phrase "plurality of quantum ridges" refers to two or more quantum ridges.

For the purposes of the present invention, the term "quantum structure product" refers to any product made according to the present invention. For the purposes of the present invention, the term "quantum" refers to the quantum nature of many of the applications for the quantum structure products of the present invention, including even the biological and chemical applications, because of the added benefit of having molecules and atoms close enough in a structure for quantum mechanical interactions.

For the purposes of the present invention, with respect to quantum ridges, the term "center line" refers to a line along the center of a ridge substantially parallel to the pair of grooves on either side of the ridge. For example, a quantum ridge which is 3.0 Å in width would have a center at 1.5 Å from the grooves on either side of the ridge. For the purposes of the present invention, with respect to quantum tips, the term "center line" refers to a line through the center of a quantum dot which is substantially parallel to a pair of the grooves surrounding the quantum dot.

For the purposes of the present invention, the term "channel" refers to the fact that all of the quantum ridges on a (1 1 X) surface in preferred substrates of the present invention, which comprise diamond and zincblende lattices, are in the "best" channeling direction of a single crystal in these diamond and zincblende lattices, namely a <1 1 0> direction for (1 1 X) surfaces. For the purposes of the present invention, the term "single channel wall thickness" or "SCWT" refers to the minimum thickness for the narrowest ridge for a particular substrate type, such as the quantum ridges 42 of FIG. 4. In silicon products, ridges that are thicker than the SCWT will have thicknesses of an integral multiple of 3.14 Å when measured across their narrowest cross section.

For the purposes of the present invention, two quantum ridges are considered to be "adjacent" if the quantum ridges are separated from each other by a bordering groove. For the purposes of the present invention, two quantum tips are considered to be adjacent to each other if they are separated from each other by a bordering groove.

For the purposes of the present invention, with respect to quantum ridges, the term "pitch" between two quantum ridges refers to the distance between the substantially parallel lines of two adjacent quantum ridges. For the purposes of the present invention, with respect to quantum tips, the term "pitch" refers to the distance between the substantially parallel center lines of two adjacent quantum tips.

For the purposes of the present invention, the term "semiconductor material" includes all kinds of semiconductors including silicon, group III–V semiconductors such as gallium arsenide, etc.

For the purposes of the present invention, with respect quantum tips, the term "width" refers to the distance of the longest line which passes through the center of a quantum tip as well as two edges of the quantum tip.

For the purposes of the present invention the term "(1 1 X)" refers to a substrate surface of a crystalline material produced by cutting the material on a (1 1 X) plane or within 5° in any direction of a (1 1 X) plane, where X may have any value from 0 to 310 and X may have integer or certain non-integer values. For example, Si (1 1 2.4) may be produced by cutting an ingot of Si on a (5 5 12) plane, which is located 30.5° from the (0 0 1) plane by tilting toward in the [1 1 0] direction.

For the purposes of the present invention the term "semiconductor material" refers to both doped and undoped semiconductor materials, unless the semiconductor material is specifically referred to as a doped semiconductor material or an undoped semiconductor material.

For the purposes of the present invention, the term "group III–V semiconductor material" refers to any semiconductor material comprised of one or more group III elements: B, Ga, Al, In, etc. and one or more group V elements: N, As, Sb, P, Bi, etc. For the purposes of the present invention, the terms "group II–VI semiconductor material" refers to any semiconductor material such as ZnSe, CdS, etc. comprised of one or more group II elements and one or more group VI elements. For the purposes of the present invention, the terms "group I–VII semiconductor material" refers to any semiconductor material such as NaCl, LiF, etc comprised of one or more group I elements and one or more group VII elements. For the purposes of the present invention, the terms "group IV—IV semiconductor material" refers to any semiconductor material such as SiC, GeSi, GeSnSi, etc. comprised of two or more group IV elements.

For the purposes of the present invention, the term "crystalline material" includes single crystal metal like Pt, Au, etc., as well as to insulators such as MgO, crystal quartz, etc., and also to high temperature superconductors. An important factor is that the (1 1 X) surfaces, or their channel direction counterparts in other crystal systems, have a surface morphology that may be "amplified" using one or more methods of the present invention.

For the purposes of the present invention, the term "MOSFET" refers to a Metal Oxide Semiconductor Field Effect Transistor.

Description

This present invention provides quantum ridged and tipped structures having very small dimensions, up to at least 1 micrometer, that are determined by the surface of single crystals of a restricted set of crystal orientations, or Miller indices HKL. By a simple modification of the quantum tip producing method of the present invention, it is possible to fabricate regular arrays of "extended tips" having lengths up to 1 micrometer while maintaining widths of 47 Å or less. These structures may be produced without any of the more normal forms of lithography. The separation produced between the ridge and tip structures of the present invention may be more than 100 times smaller than the smallest dimensions now being produced on modern ICs in production.

There are a number of methods that may be used to produce the quantum structures, of the present invention. However, the present invention will focus on one of the most preferred methods using simple oblique incidence evaporation of an etch resistant metal onto a pristine silicon surface under Ultra High Vacuum UHV conditions, and then following this by a brief etching step (dry or wet). Other single crystal materials other than silicon may also be used for the substrate, for example, Ge, diamond, and the III–V compounds, as well as other compounds and even metal crystals. There are many applications for the quantum structured surfaces of the present invention, from MOSFETs with radically different properties depending on the direction of travel of the carriers, to superconductors with interspaced Buckyballs or nanotubes. Also, a "crossed wafer" process described below also allows the production of immense quantum dot arrays of great variety regarding dot size and type. The present invention allows such dots to be produced with great reproducibility in a quite simple manner and at a size that is considerably smaller than may be fabricated by most other methods. The Si based structures of the present invention may also be passivated using conventional high quality oxides or other dielectrics, metals, molecular coatings, or in some cases by simply hydrogen passivation in a UHV system or by well know wet chemical processes. A preferred type of passivation is to at least partially cover or fully cover by "encapsulating" the quantum wires or quantum dots with a material having a larger band gap than the quantum wires or dots, since this helps reduce the density of surface states. For example, if the quantum dots are on silicon, quantum tips are made from CdS (band gap of 2.42 eV), a ZnS (band gap of 3.68 eV) encapsulating layer is a good choice. The metal quantum wire and dot, and the semiconductor ridge and tips, may also be coated with a hard material such as diamond-like carbon (DLC), $Si_xN_y$, etc. to protect surfaces against abrasion during physical contact of different types.

For preparing quantum ridge products of the present invention, a substrate, preferably a semiconductor wafer, most preferably a circular Si (1 1 X) wafer, is prepared by standard chem-mechanical polishing methods. When the substrate is a silicon wafer, the substrate is preferably heated in a UHV chamber at a pressure of about $10^{-10}$ Torr to a temperature of 1150° C. for a brief period ("flashed") to remove any surface oxides and then cooled to below room temperature (around −20 to 25° C.). The heating of the wafer may also be accomplished locally using a focused or beam-expanded laser passing through a quartz window in the molecular beam epitaxy (MBE) system. This heating process leaves the surface in a stable condition with slightly elevated ridges or misalignment steps having a pitch of 5.4 to 600 Å, most preferably 9.4 to 54 Å for surfaces of (1 1 2) to (5 5 12), respectively. The ridges may have occasional atomic steps in them along their length due to the slight variations from perfect flatness of the wafer surface, but after each misalignment step, the ridges again establish themselves in the same <1 1 0> direction. In addition there may be occasional reconstruction faults in the surface, especially on the (5 5 12) surface. By contrast the (1 1 4) surface is generally completely free of restructuring faults.

Figure 3:
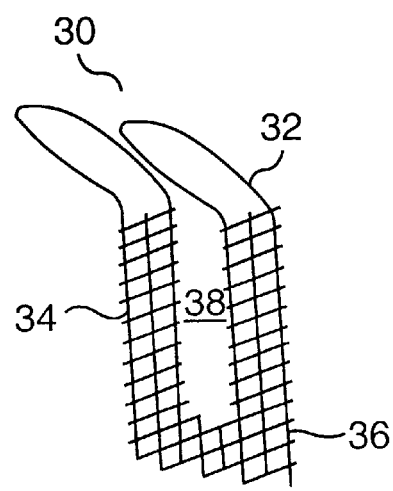
FIG. 3 is a cross-sectional view of a deep groove quantum-wire quantum-ridge product of the present invention in which the substrate is not rotated during evaporation.

The substrate is then coated to form quantum wires on the ridges. A preferred technique for forming quantum wires is to use oblique evaporation at a small angle of 1 to 5° (or up to 30 degrees is effective in some cases) with an etch resistant (or in certain quantum wire applications "conductive") metal such as Au or Cr, or Al or Be so that the slightly higher (by about 3 Å) ridges are coated preferentially with 5 to 30 Å of the metal relative to the intervening very shallow trough of the restructured clean surface. Preferably, the substrate is rotated during this process while maintaining the obliquity to improve the uniformity of coverage along the ridges. This rotation also helps to avoid bridging of the metal due to the "lateral needles" that form when evaporating at high obliquity, as shown in FIG. 3. This rotation may be modified by blocking off the evaporating beam with a raised barrier on the sample holder or on the wafer itself along the direction of the quantum ridges so that the evaporation source never is in direct line with the atomic troughs.

For some applications, the quantum wire "etch mask" is left in place without any subsequent etching to form quantum ridge products having one or more quantum wires supported thereon. Such products may be used in the production of quantum wire arrays.

FIG. 1 shows a portion a shallow groove quantum wire-quantum ridge product 10 of the present invention having quantum wires 12 deposited on quantum ridges 14 of substrate 16 with the very shallow grooves 18 of the restructured surface between ridges 14. Only a portion of the product 10 is shown for simplicity. As an example, gold may be deposited obliquely onto the atomic ridges of ultra high resistivity (1 1 4) silicon. The latter is produced by compensating the shallow As donors with approximately equal concentrations of either Au or Zn deep acceptors by diffusion to give a resistivity of about $10^5$ ohm-cm. If the Au quantum wires such as those shown in FIG. 1 have a width of 10 Å, an average height of 20 Å, and a pitch of 16.3 Å typical of the (1 1 4) surface, it is readily shown that the resistance/square of the Au in a direction parallel to the quantum ridges should be about 20 ohm/square if the Au has the resistivity of bulk Au. The resistance of the high resistivity Si is about $2 \times 10^6$ ohm/squared. Thus, the Au layer will dominate the conductance even if the ultra thin Au wires have resistivity as much as 100 times larger than the bulk Au, which is about normal for such thin Au stripes. Furthermore, the resistance should be much higher in the direction perpendicular to the quantum wires since the lateral gaps between the wires of about 6.3 Å will not allow much tunneling.

Perhaps a more important application of oblique evaporation of a metal on a quantum ridge surface occurs when Al is evaporated at a shallow angle onto a very thin gate oxide of 10 to 15 Å whose surfaces replicates the restructured (5 5 12) surface to a significant degree. If the sample is not rotated during evaporation, the gate metal of a quantum wire such as that shown in FIG. 3 will bridge into a continuous film after deposition of 500 Å of more. However, there will be atomic width gaps in the gate contact which will cause the local electric field to be higher in regions where the oxide surface has good metal contact. This will cause the inversion layer of an oxidized (5 5 12) wafer to have strong undulations in thickness every 15.7, 15.7, and 22.1 Å sequentially across the interface. The important point is that no etching or growth of the initial $SiO_2$:Si surface before evaporation in this application.

To make quantum ridges for other applications, the substrate may be removed from the vacuum system and etched. For example, the SALAS substrate may be etched with a preferred solution such as ethylene diamine (EDA) and water (54 vol % EDA) (or in a 50 wt % solution of KOH:water), so that several layers of substrate atoms are removed from the shallow grooves and the quantum wires serve as an etch mask for the ridges. The etched grooves may have a depth of 10 to 1000 Å. When the substrate is Si (5 5 12), the tilted walls of the grooves are near the {111 }, so the lateral etching will be markedly slower than the vertical etch. Instead of using a wet chemical etchant, the etching may also be accomplished using in situ appropriately directed ion bombardment in an MBE system, or plasma etching in a separate system. With respect to etching Si (5 5 12), one of these dry etching processes will generally lead to deeper grooves without the limitation of one of the slow chemical etching {1 1 1 } planes on one wall of the groove that may limit the etching depth due to an angle of considerably less than 90 degrees relative to either the (5 5 12) or the (1 1 4) surface.

Figure 2:
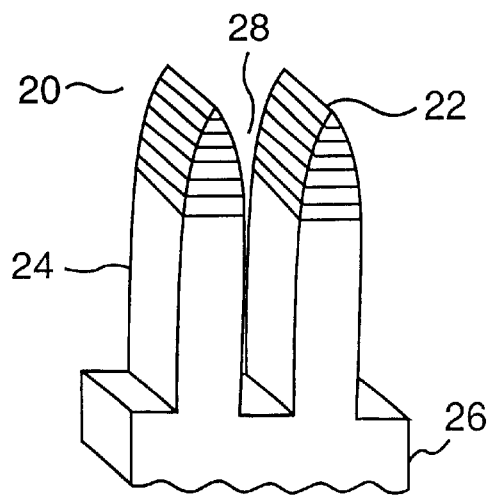
FIG. 2 is a cross-sectional view of a deep groove quantum-wire quantum-ridge product of the present invention after evaporation while rotating the substrate and after etching the semiconductor.

FIG. 2 shows a portion a deep groove quantum wire-quantum ridge product 20 of the present invention having quantum wires 22 deposited on quantum ridges 24 of substrate 26 with deep grooves 28 which have been etched between ridges 24. Only a portion of the product 20 is shown for simplicity. FIG. 3 shows a portion of a deep groove quantum wire-quantum ridge product 30 of the present invention having quantum wires 32 deposited on quantum ridges 34 of substrate 36 with deep grooves 38 which have been etched between ridges 34. In product 30, the quantum wires 32 have been deposited on the ridges 34 at an angle so bridges will form when needles from one of the wires 32 extend to another of the wires 32. Only a portion of the product 30 is shown for simplicity.

Figure 12:
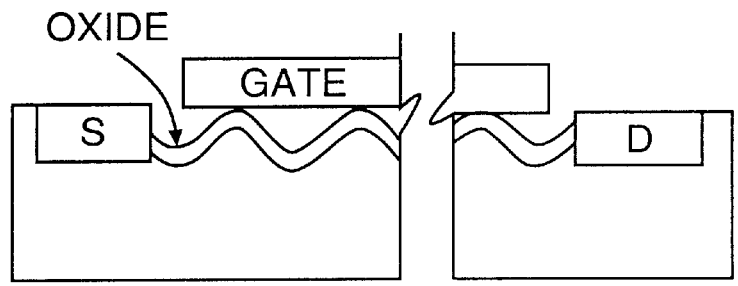
FIG. 12 illustrates a MOSFET device made using a product of the present invention.
Figure 13:
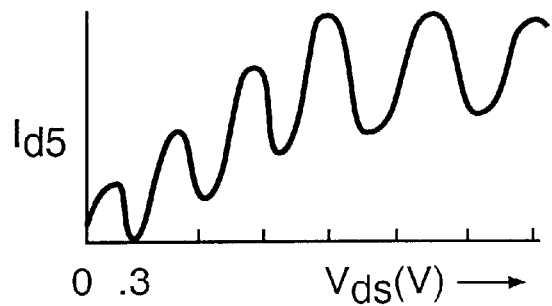
FIG. 13 illustrates the idealized I–V characteristic of a (1 1 4) MOSFET made using a product of the present invention.
Figure 14:
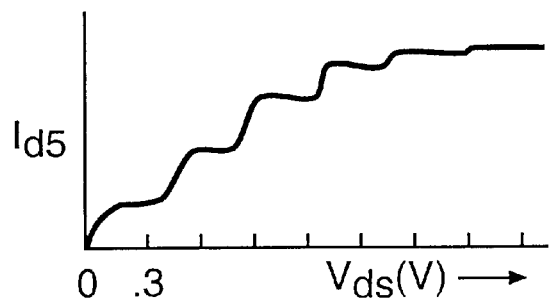
FIG. 14 illustrates a possible I–V characteristic of a (5 5 12) MOSFET made using a product of the present invention.

The quantum structure product of the present invention may be used to form MOSFETs as shown in FIG. 12. The separations of the oxidized gate undulations for a (1 1 4) surface of the present invention are 16.3 Å. Only three undulations of the 100 or more undulations between source and drain are shown. The inversion layers will form stripes at the points under the gate metal of highest electric field. The electrons of the nMOSFET may move by quantum tunneling form source to drain. The I–V character for a (1 1 4) device is shown in FIG. 13. This character is predicted for similar low temperature (<4° K) MOSFETs made by E-beam lithography using much larger fingers (1,000 Å separated by 2,000 Å). The regions of negative resistance in FIG. 13 are excellent generators of microwaves, but may cause oscillations in ICs. These Bragg Law Oscillations will be suppressed by geometrical modifications of S and D, or by various types of injections. For IC's, the plateaus of FIG. 14 are probably the preferred I–V character, and these may be obtainable with the geometrical spacings of the (5 5 12) MOSFETs or by variable width S-D modifications on the (1 1 4) surface. If such an I–V character may be obtained, a 100× reduction in power consumption near and above room temperature could be obtained by operating on the first plateau at about 0.3 V (rather than near 3 V as done with present day MOSFETs), since power consumption is given by $V^2/R$.

Although only one preferred method of depositing the quantum wires on the substrate is described above in detail, other methods may also be employed. For example, the quantum wires may be formed using a high temperature cleaning in an ultra-high vacuum (UHV) followed by oblique evaporation and subsequent wet or dry etching. Another method for forming quantum wires is to use electrochemical deposition using under-potential deposition (UPD) followed by etching. Still another method is to use Cd, Ag, Cu, or other materials on the substrate to influence subsequent deposition or etching processes. Yet another method is to use alkanethiols or silanes to deposit on particular bonding sites on the substrate followed by other depositions or etchings. Yet another method which may be employed is field enhanced metal organic deposition on high curvature atomic ridges.

For other applications, the quantum wire may then be removed in multiple aqua regia or KCN or other conventional chemical removal steps. The resultant deep grooved quantum ridge product may then be used in a MOSFET fabrication cycle. For use in MOSFETs, the substrate is handled like a normal wafer from this point forward, except that the oxidation step and other steps are designed to maintain the quantum ridge surface until the gate dielectric is formed, for example by covering the ridges with silicon nitride or other dissolvable materials. In a production process, the ridge producing process may also be done only in the gate oxide regions after many of the thick oxide and source and drain implantation and diffusion processes are completed. The brief ultra-high vacuum heat treatment at 1150° C. to remove native oxides may cause problems for some of these steps. In such circumstances, an ion bombardment at a lower temperature may be used to clean the wafer and cause restructuring of the (1 1 X) surfaces for subsequent processing.

Figure 4:
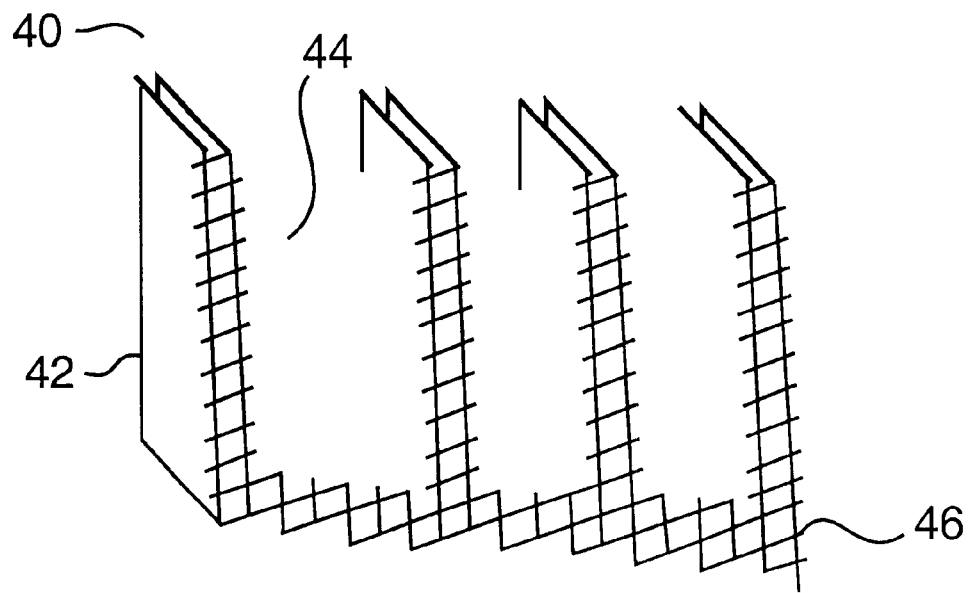
FIG. 4 is a cross-sectional view of a deep groove quantum ridge product of the present invention showing a unit cell of a (5 5 12) product after processing.
Figure 5:
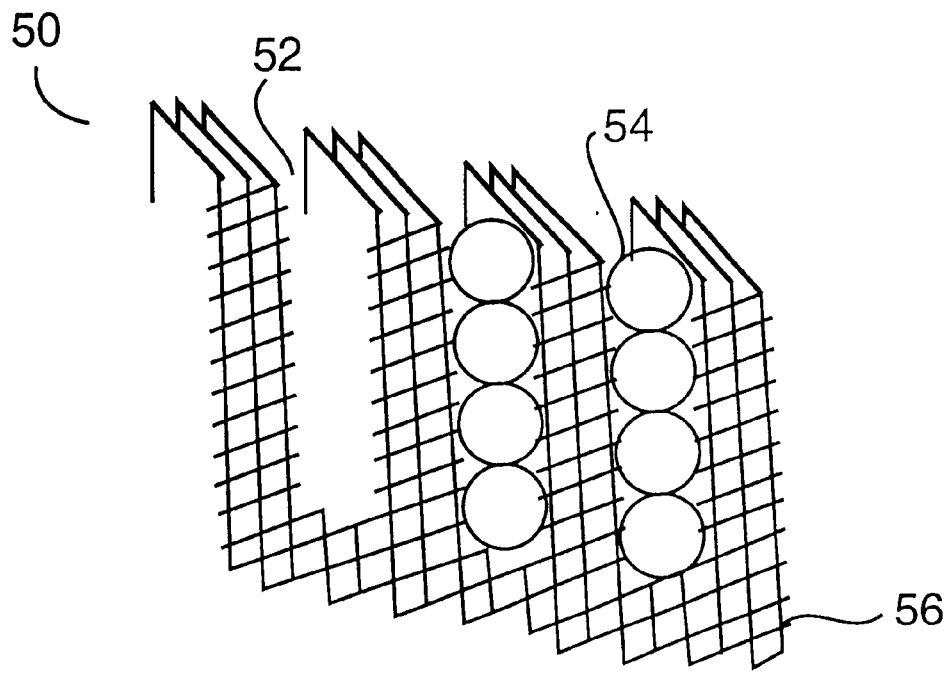
FIG. 5 is a cross-sectional view of a deep groove quantum ridge product of the present invention showing the grooves of a (1 1 4) product.

FIG. 4 illustrates a portion of a deep groove quantum ridge product 40 having quantum ridges 42 separated by quantum grooves 44 formed in a Si (5 5 12) substrate. Although, in the quantum ridge product 40 shown in FIG. 4 grooves 44 have different widths, and this pattern of different widths is repeated throughout the product 40, quantum ridge products of the present invention may have grooves which are all the same width. This regularity is illustrated in FIG. 5 for a (1 1 4) substrate. FIG. 5 illustrates a portion of a deep groove quantum ridge product 50 of the present invention in which some of the grooves 52 are filled with objects 54 such as an organic molecule, a fullerene (bucky) ball, or a fullerene tube. The objects 54 may either partially or completely fill one or more grooves 52 depending on the application for the product 50. The grooves 52 are about 32 Å deep. When long chain organic molecules are placed in the grooves of the present invention, the size of the grooves may be chosen to have a ispecific width for holding particular diameter molecules. The ridges on either side of the grooves may either be thin, to allow for lateral atomic motion, or thick, as much as 15 single channel wall thicknesses thick to provide rigidity to the grooves. Although product 50 is a formed in a Si (1 1 4) substrate 56, "filled groove" products may be made from Si (5 5 12) substrates as well.

$C_{60}$ superconductors have already been demonstrated with critical temperature $T_c$ up to 37 K by diffusing small quantities of alkali metals in $C_{60}$ single crystals. It is possible to deposit deformable 10 Å diameter $C_{60}$ or the smaller $C_{36}$ molecules into the 9.4 to 12.6 Å wide grooves of the present invention then diffuse alkali metals into the grooves (See FIG. 5). Since the $C_{60}$ or the smaller $C_{36}$ will pack in a quasi-close-packed manner in the highly deformable walls, this will almost certainly produce a superconductor, perhaps with a higher $T_c$ above 77° K. Therefore, the quantum structure products of the present invention may allow for the production of zero loss interconnect systems for IC's operating at low temperatures.

To make quantum tip products of the present invention, the quantum ridge process described above may be interrupted after the quantum wires are deposited on the quantum ridges, or after ion etching or wet etching the grooves a small amount. Using even a brief etch may leave the quantum wires intact along their length, while giving the surface a bit of surface relief which is useful for forming quantum dots by removing material from portions of the quantum wires. A preferred way to remove material from portions of the quantum wires to "cut" the quantum wires is to use a second single crystal wafer to cut the quantum wires. Thus, the second wafer may also have regularly spaced quantum ridges, either a pristine freshly flashed shallow groove surface like the one discussed above (before depositing the quantum wire), or one that has been through the process of forming a somewhat deeper groove quantum ridge product of the present invention. In a preferred method, quantum wire material is removed from a deep groove second "atomic-cookie-cutter" wafer before using it to cut the quantum wires on the first wafer.

The second wafer may then be aligned perpendicular (or at some other specified angle) to the first wafer, substrate, and pressed carefully onto the surface of the first wafer. The wafers are allowed to contact each other without any significant lateral shifting by first contacting the flat bottom edges of the otherwise circular wafers and then letting gravity close them like closing a book. The Van der Waals forces between the two surfaces then finishes the bonding process so that there is no lateral shifting of the wafers. To ensure that the quantum wires are completely cut, a weight may be placed on the wafer sandwich. This bonding process may be accomplished by any of the standard methods, for example, in air, in an inert gas, in a vacuum, or in a liquid such as deionized water, dilute HF, alcohol, or other chemical. The preferred ambient solution for producing quantum dots is dilute HF.

The wafers are then separated while still in the liquid with a thin wedge inserted into the edge of the wafer stack, again being careful that there is no lateral shifting during the separation (debonding) step. The metal coated bottom wafer may then be dipped into DI water for 5 minutes and dried face up to avoid disturbing the quantum dots that result from this treatment. The quantum wire material need not be completely removed from the regions cut with the second wafer, but the few monolayers MLs of thickness of the quantum wires will generally be compressed into the monolayer thickness regime and squeezed sideways out of the previously electrically continuous quantum wires. This squeezing process is generally adequate to disrupt the conductivity along the atomic wires and make them into "quantum dots".

As mentioned previously, the above steps may also be done in $N_2$, Ar, He, or other inactive gas, as well as in Ultra High Vacuum (UHV), etc., although the procedure in HF or the dilute HF, or HF and ethanol leaves the surface in an H-passivated state, which is an advantage for some applications. The dilute HF mixtures are preferred when the quantum wire is either Be or Al. A typical quantum dot formed by the above process may contain 10 to 5000 atoms.

The process of forming the quantum tip product of the present invention may be stopped at this point to produce a shallow groove quantum tip product. Such a product is useful in such applications as light modulators or as field emitting tips for display purposes. As field emitters, a large number of quantum tips in a lithographically defined group forms a single emitting area of a large array. The very small radii of the curvature of 1 to 10 Å of the quantum tips ensures a very high electric field at all the tips, even at very low applied voltages.

In another embodiment, the shallow groove product may be etched to form a deep groove quantum tip product using etching techniques such as those described above for forming a deep groove quantum ridge product having a maximum groove depth of up to 3,000 Å. Such a deep groove quantum dot product may be used in such applications as quantum metal oxide field effect transistors (MOSFETs). In this case, metal free quantum tips of 20 Å height, for example, may be oxidized to form quantum bumps on the gate oxide. The gate metal may be deposited in such a way as to contact only the quantum bumps on the oxide, for example, using oblique evaporation and allowing the needles to form on each bump and then bridge together for the gate metal contact, as discussed earlier for the quantum ridge MOSFET. On a p-type substrate, the application of a positive gate voltage on the quantum bump gate oxide creates a sort of 2-dimensional lattice of very small n-type inversion regions at the oxide interfaces. The position of the source and drain S-D relative to the inversion-region-lattice determines the current-voltage I–V character similar to the effects of the Bragg transmission and reflection of X-rays in a crystal lattice. At particular voltages (and concomitant electron wavelengths), the electrons pass easily between S and D (high current), and at other voltages there is strong reflection of electrons (low current). Changing the direction of the current flow by using a different set of S-D contacts will cause major shifts in the I–V character. These are similar to the I–V characteristics discussed earlier with respect for MOSFETs made with quantum ridges, but the quantum bump gate oxide MOSFETs are much more sensitive to current direction.

Instead of separating the two wafers in the quantum tip process described above, the two wafers may be left together using either a dry or wet bond, either as pure silicon bonded substrates (by removing the quantum dot material using a conventional metal removing solution such as those described previously), or with one or both substrates containing quantum dots. These bonded wafers may be used to make a light emitting diode, or an injection laser, or the perpendicularly (or other angle) bonded substrates may be used as a gas permeable bond for catalytic purposes, or as a way to remove any oxide at the interface by heating the bonded substrates in a hydrogen ambient (thereby obtaining a pristine silicon to silicon bond for electronic and other applications).

Figure 6:
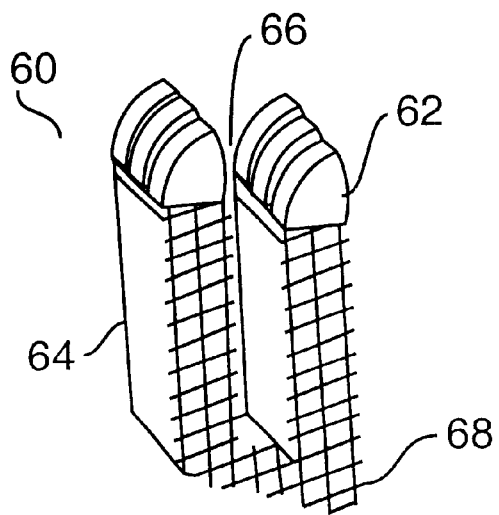
FIG. 6 is a cross-sectional view of a deep groove quantum dot-quantum ridge product of the present invention.

In addition to forming quantum dots on quantum tips, the present invention provides quantum dots formed on quantum ridges. Such quantum dot-quantum ridge products may be formed by using deep groove quantum wire product of the present invention and cutting the quantum wires using a second wafer having quantum ridges thereon as described above for forming quantum dots on quantum tips. FIG. 6 shows a quantum dot-quantum ridge product 60 of the present invention in which quantum dots 62 are supported on quantum ridges 64. Quantum ridges 64 are separated by a groove 66. For simplicity, only two of the ridges and only a portion of substrate 68 of the quantum dot-quantum ridge product is shown in FIG. 6. A quantum dot-quantum ridge product of the type shown in FIG. 6 may also be used as a precursor for forming a deep groove quantum dot-quantum tip product or a deep groove quantum tip product by etching substrate material from the portions of the quantum ridges which are not protected by the quantum dots.

The production of quantum ridges and dots of the present invention is not a "lithography" in the normal sense that allows arbitrary patterns to be placed in arbitrary positions on a wafer. However, by introducing atomically flat regions in the critical locations on real world "nominal (1 1 X)" wafers, most of the constraints of a good lithographic process may be met. For example, the most critical regions of nMOS and pMOS transistors are the gate regions. By producing very smooth depressions, or very smooth convex surfaces, one may force the formation of atomically flat regions near the bottoms of the depressions, or near the tops of the convex surfaces.

Figure 7:
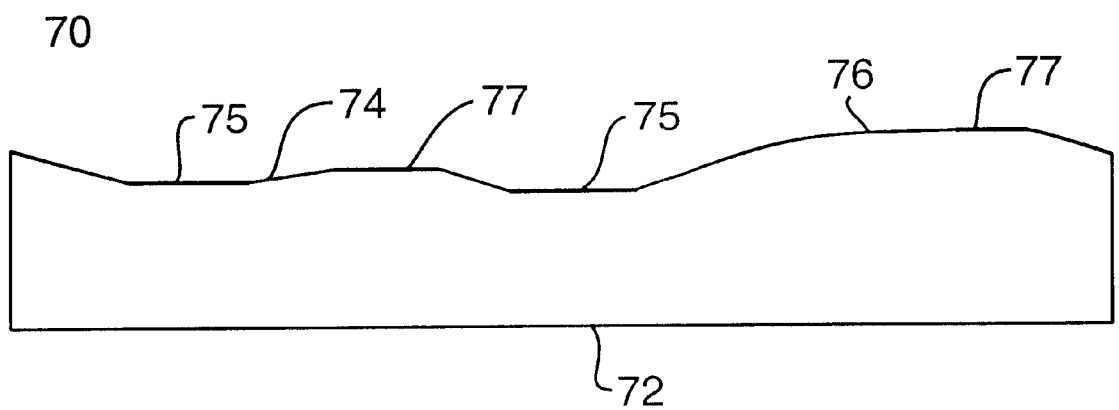
FIG. 7 is a cross-sectional view of a substrate of the present invention having depressions with flat regions and convex regions with flat regions on which ridges and tips may be formed.

A preferred method to produce depressions is to use $KOH:H_2O$ to thin a wafer by a small amount (2.5 $\mu$m) after introducing small etch pit (0.5 $\mu$m in diameter). After thinning this small amount, the etched depression is extremely smooth and has a diameter of 10 $\mu$m with a sagitta of only 0.18 $\mu$m. The surface quality near the bottom of the depression is nearly atomically flat after this very simple process. This atomically flat region may then by enlarged by a touch up with normal chem-mechanical polishing CMP step, and/or by heating the sample in UHV for 75 minutes at 1150° C. Large atomically flat regions may also be formed in UHV by Ar ion bombardment at 950° C. for less than 5 minutes. A much exaggerated view and two different convex regions are shown in FIG. 7 after a brief (5 minute) CMP process. This is preferably followed by an Ar ion bombardment in UHV for 3 to 5 minutes to expand the atomically flat regions to several $\mu$m width and length, which is more than large enough to place the gate regions of nMOS or pMOS transistors. The atomically flat regions are emphasized by dark lines in FIG. 7. FIG. 7 shows a cross-sectional view of a substrate 72 having depressions 74 with flat regions 75 and convex regions 76 with flat regions 77. The depressions and convex regions may be oblong along the quantum ridge directions, or perpendicular to the quantum ridges, or at arbitrary angles to the ridges for particular applications. For example, the source and drain regions may be quite wide relative to the length, which is desirable for a high transconductance.

Another interesting variant of a quantum ridge MOSFET is for S and D regions to conduct electrons in nMOS (or holes in pMOS) in a direction parallel to the quantum ridges, rather than perpendicular. "Quantum confinement" of the carriers under the extremely narrow gate ridges may lead to anomalously high mobillities, as well as possible efficient light emission. At low temperatures, a superconducting phase may exist due to a sort of exciton ordering at critical voltages due to the counter-flow of electrons and holes in the neighboring inversion layers and bulk regions, especially acting through thin depletion regions of a heavily doped substrate.

Figure 8:
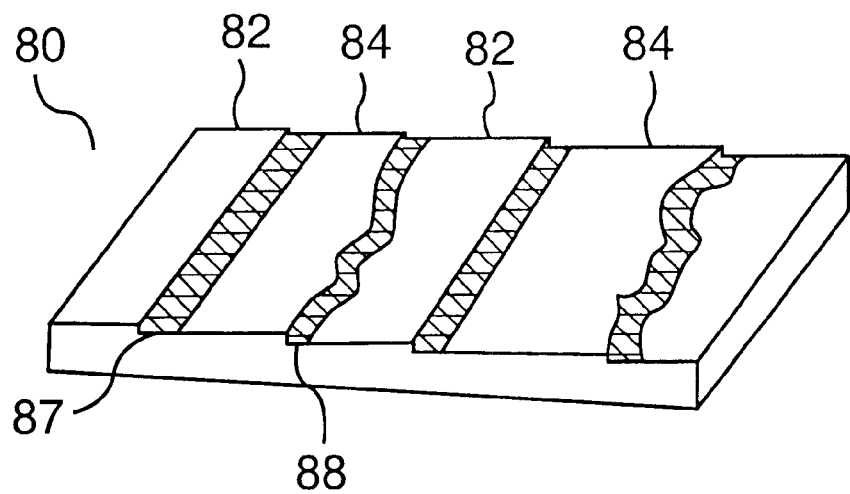
FIG. 8 is a cross-sectional view of quantum wire material deposited on a portion of a terraced substrate having single layer atomic steps and obliquely evaporated deposition from the right.
Figure 9:
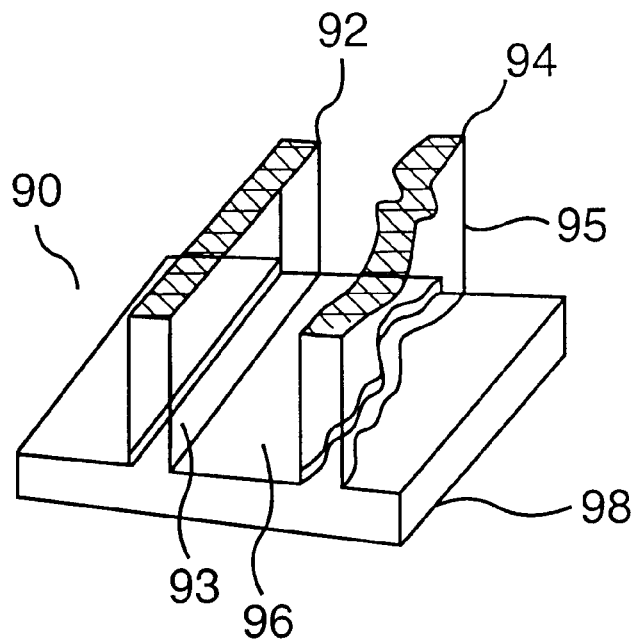
FIG. 9 is a cross-sectional view of a portion of a quantum-wire quantumridge product formed using a substrate having double layer atomic steps and obliquely evaporated deposition from the right.

FIGS. 8 and 9 show an alternative method for forming quantum ridges and wires of the present invention. FIG. 8 shows a terraced substrate 80 having a series of terraces 82 and 84. Quantum wire material 87 and 88 is deposited against the stepped edges of terraces 82 and 84, respectively, by oblique evaporation deposition from the right of the figure. The terraces 84 have crooked edges and, therefore, quantum wire material 88 is deposited in a crooked shape. FIG. 9 shows a quantum wire-quantum ridge product 90 having straight wires 92 and ridges 93 (of which only one of each is visible in FIG. 9) and crooked wires 94 and ridges 95 (of which only one of each is visible in FIG. 9) separated by a groove 96 in substrate 98. The product 90 may be formed by etching away portions of the substrate 80 in FIG. 8 which are not protected by the quantum wire material as described above in the methods for making other quantum structure products. The quantum wire-quantum ridge product shown in FIG. 9 may be used to for quantum ridge products, quantum wire products and quantum dot products using methods similar to those described previously for forming such products.

Figure 10:
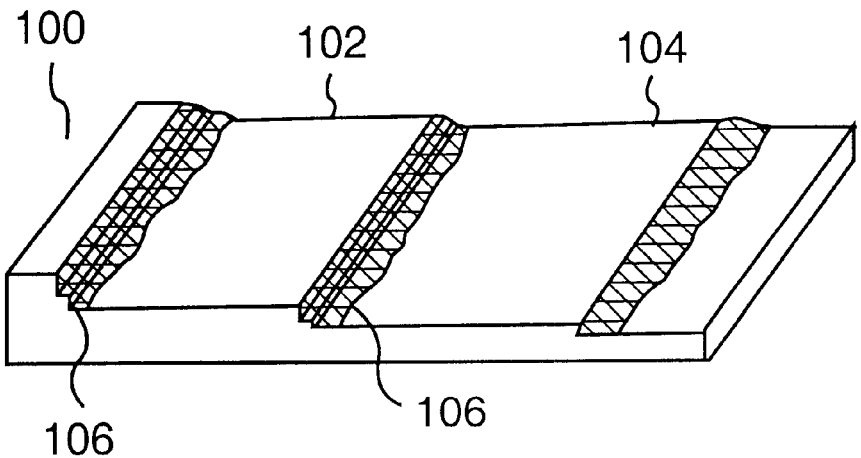
FIG. 10 is a cross-sectional view of quantum wire material deposited on a portion of a terraced substrate.
Figure 11:
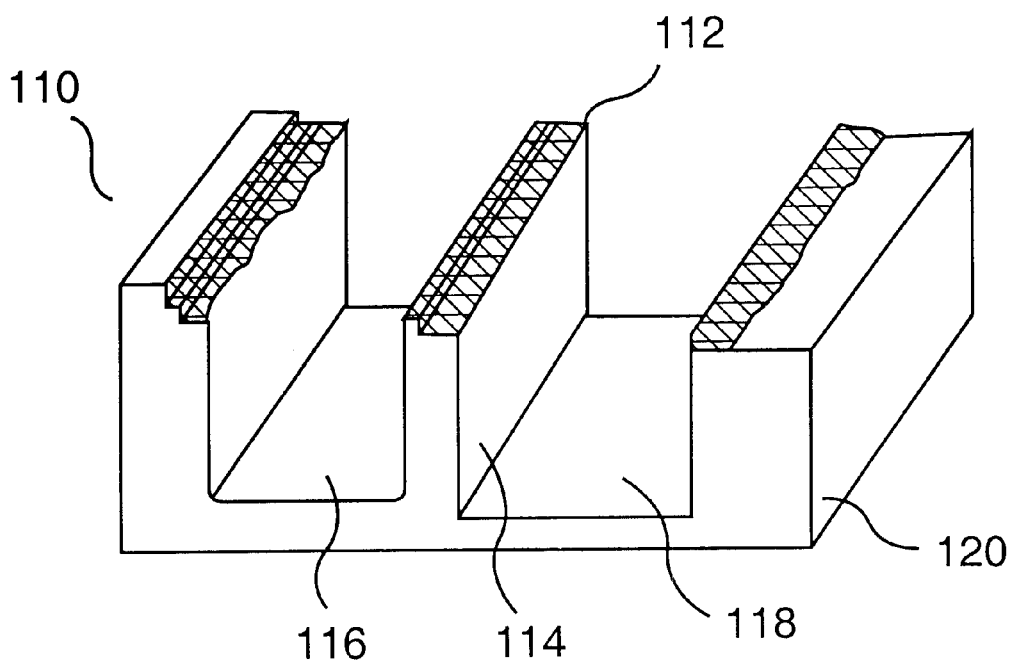
FIG. 11 is a cross-sectional view of a portion of a quantum-wire quantumridge product formed using the substrate of FIG. 10.

FIGS. 10 and 11 show another alternative method for forming quantum ridges and wires of the present invention. FIG. 10 shows a terraced substrate 100 having a series of terraces of which only two terraces 102 and 104 are visible in FIG. 10. Quantum wire material 106 is deposited against the double stepped edges of terraces 102 and 104, by oblique evaporation deposition from the right of the figure. FIG. 11 shows a quantum wire-quantum ridge product 110 having a quantum wire on top of a quantum ridge 114. On either side of quantum ridge 114 are grooves 116 and 118. The product 110 may be formed by etching away portions of the substrate 100 shown in FIG. 10 which are not protected by the quantum wire material as described above in the methods for making other quantum structure products. Because the terrace 102 is higher than the terrace 104 in FIG. 10, the groove 116 is higher than the groove 118 in FIG. 11. The quantum wire-quantum ridge product shown in FIG. 11 may be used to for quantum ridge products, quantum wire products and quantum dot products using methods similar to those described previously for forming such products.

The quantum ridges of the present invention preferably have a width of about 3 to 594 Å. The center line-to-center line separations or "pitch" for each pair of adjacent quantum ridges is preferably 5.4 to 600 Å, most preferably 9.4 to 54 Å. The grooves of the present invention preferably have a depth of 4 to 30,000 Å. The 4 Å lower limit for the preferred groove depth is chosen by assuming that a single row of atoms is removed from the grooves of the restructured surfaces of a Si substrate all along their length. If no atoms are removed from the restructured surfaces, the deepest depressions in the restructured surfaces are generally about 3 Å for Si (5 5 12) and about 2 Å for Si (1 1 4). This small amount (4 Å) of surface undulation will be useful in some applications. A pitch of 6.4 Å for Si (113) and 5.4 Å for Si (110) are possible and are useful for quantum wire spacings. However, if atoms are removed from the two-channel-wall thicknesses of 6.4 Å to attempt to produce grooves, the walls may be subject to collapse. Thus, a preferred pitch between quantum ridges is 9.4 Å when the grooves in a substrate are to be deepened, thereby allowing a double channel width groove to be etched (or ion bombarded) having a width as small as 6.3 Å, which is generally rounded to 6 Å. The grooves of the present invention are preferably 6 Å to 51 Å in width. For quantum structure products of the invention in which the grooves between ridges or tips are etched, the grooves preferably have a depth of 4 to 30,000 Å. For grooves having a width of 6 to 51 Å, a preferred depth is 4 to 3000 Å in order to maintain stability of the grooves and ridges.

The quantum tips of the present invention have a width in at least one direction of about 3 to 594 Å. The center line-to-center line separations or "pitch" for each pair of adjacent quantum tips is preferably 5.4 to 600 Å in at least one direction, most preferably 9.4 to 54 Å in at least one direction. As with the grooves on either side of the quantum ridges, the grooves surrounding the quantum dots of the present invention preferably have a depth of 4 to 30,000 Å and have a width of 6 Å to 597 Å. For quantum structure products of the invention in which the grooves between tips are etched, the grooves preferably have a depth of 4 to 30,000 Å. For grooves having a width of 6 to 51 Å, a preferred depth is 4 to 3000 Å in order to maintain stability of the grooves.

The quantum wire and quantum dots of the present invention are preferably made from a conductive material, such as a metal. For quantum structure products of the present invention in which one or more quantum wires is supported on one or more quantum ridges, the quantum wire preferably has a width of 3 to 594 Å. For quantum structure products of the present invention in which one or more quantum wires is supported on one or more quantum ridges, the quantum wire preferably has a width of 3 to 594 Å. For quantum structure products of the present invention in which a quantum dot is supported on one or more quantum tips, the quantum dot preferably has a width in at least one direction of 3 to 594 Å. The preferred thickness for the quantum wires and quantum dots is between 6 and 100 Å, since below 6 Å the conductivity will be very poor, and above 100 Å the narrow (for example, 3 to 6 Å width) wires will tend to delaminate from the quantum ridges and tips. On the other hand, as a temporary etch mask, the useful thickness of the deposited material may be as small as 3 Å, which is of the order of one monolayer (ML) thickness.

The substrate material for the present invention preferably is made from a single crystal material such as a metal, an organic compound, etc. For many applications, a preferred substrate is a semiconductor material such as Si, a III–V semiconductor material such as GaAs, InSb, BN, etc. For many applications, silicon is a most preferred substrate material. Because the processes which may be used for depositing the deposition material on the substrate, such as oblique evaporation, special chemical vapor deposition (CVD), and electrochemistry, are often not substrate specific with respect to amplifying the surface morphology of a substrate on a nanoscale, many different types of substrates may be used for the present invention.

For some applications, such as producing a MOSFET using quantum structure product of the present invention, an oxide may be deposited on the quantum ridges or quantum tips of the present invention. The deposited oxide is not generally a single crystal, although it may be in special applications. The deposited or grown oxide generally contours to the texture of the substrate formed by the quantum ridges or tips to a significant degree, albeit perhaps with somewhat less depth variation. For example, if an Si substrate has regularly spaced groove depths of 10 Å on a pitch of 16 Å, a grown oxide on this surface of average thickness 20 Å (a typical gate oxide thickness on a modern MOSFET) may have regular surface undulations of only 2 to 5 Å (the depth depending on the growth temperature and other processing parameters). Nevertheless, this undulation in the amorphous oxide is enough to create atomic scale ridges for making "atomic stripe gate metal contacts" and quantum wires and striction free surfaces for micromachining and for special fusion bonding requirements. This type of atomic width stripe for a MOSFET opens up a number of possibilities for the quantum MOSFETs. The quantum wires of the present invention may also be used in inversion layer superconductivity products, as well as for light emitting diodes and lasers in Si. The latter light emission is not usually possible in bulk silicon except at very low quantum efficiency because of the indirect band gap. However, the surface and the narrow structures remove certain restrictions in this regard.

When quantum dots are formed by pressing a substrate coated with quantum ridges of the present invention onto a second substrate having quantum wires of the present invention formed thereon so that the quantum ridges intersect the quantum wires at a right angle, quantum dots may be formed on the second substrate having pitches between the dots in both the x and y directions of 5.4 to 5.4 Å, where the x-pitch may be different from, or the same as, the y-pitch.

In some embodiments of the present invention it is desirable to at least partially fill the grooves of the quantum ridge or tip product of the invention with buckyballs, either $C_{36}$ or $C_{60}$ (fullerene balls) or buckytubes (fullerene tubes), as shown in FIG. 5. Methods for producing fullerene balls and tubes suitable for use in the present invention are well known. Quantum structure products of the present invention including fullerene balls tightly packed into the grooves which may be use for producing superconductors. For example, three alkali metal atoms may be packed into a groove for every Fullerene molecule to form a silicon intercalated superconductor. When the substrate of the present invention is made from silicon, the quantum ridges and tips of the present invention may be doped with phosphorus and boron to modify the critical temperature and other superconducting properties.

The grooves of the quantum structures of the present invention may also be used as atomic troughs for long chain organic chain molecules as shown in FIG. 5. The groove widths may be used as templates for particular long chain molecular reactions. Lengths may be selected by using off-axis cuts to break off the molecules at the misalignment steps, e.g., a wafer 0.13 degrees of the "perfect" (1 1 X) orientation results in average terrace lengths of 1150 Å, which may be used to select molecules of this length for specific reactions.

Because Si (5 5 12) may not be perfectly flat, it may be desirable to flatten the surface of a Si (5 5 12) substrate prior to forming quantum ridges or quantum dots thereon by heating a localized portion of the wafer to 1,150° to 1,250° C. with a laser transmitted through a quartz window of a molecular beam epitaxy system. Another method for producing large atomically flat terraces on silicon surfaces is by Ar bombarding the wafer at 850° to 1,000° C.

The present invention will now be described by way of example.

EXAMPLE 1

Fabrication Process for Star Groove Structure

An appropriately oriented sample of Si, a (5 5 12) wafer, is prepared by standard chem-mechanical polishing methods. The wafer is placed in a UHV chamber which is pumped to a vacuum of about $10^{-10}$ torr. The Si is then heated to 1150° C. for a brief period ("flashed") to remove any surface oxides and then cooled to below room temperature (around −20° to 25° C.). The heating of the wafer may also be accomplished locally using a focused or beam-expanded laser passing through a quartz window in the MBE machine. This leaves the surface in a stable condition with slightly elevated ridges separated in Å by 16, 22, 16; 16, 22, 16, with this sequence of 54 Å width persisting over significant distances in regions where the heating occurs, and with the ridges also reaching across the whole length of the wafer. The ridges have occasional steps in them along their length due to the slight variations from perfect flatness of the wafer surface, but after each step, the ridges again establish themselves in the same <1 1 0> direction. In addition, there are occasional surface faults in the (5 5 12) sequence that disrupt the regularity of the 16,22,16, or 54 Å unit cell, repetitions. These faults have a missing 16 Å section, with the fault then effectively having only a 38 Å section instead of a 54 Å sequence. By contrast, the other good ridge forming plane, the (1 1 4), has very regular 16.3 Å spacing with no surface faults.

Some low melting point metals must be deposited on the crystalline substrates at much lower temperatures (at least as low as 64° K for some metals) to ensure that surface diffusion does not cause the metal to agglomerate and compromise the atomic ridge deposition of the SALAS process. Still, other metals have measurable surface diffusion on semiconductor and other crystal surfaces near room temperature and are not good candidates for SALAS process except at very low substrate temperatures. However, a modest heat treatment after room temperature deposition in the UHV/MBE system may sometimes result in well formed ridges on one or more sets of the different ridge-type bonding sites on (1 1 X) surfaces. For example, Au will diffuse to such sites at a temperature as low as 250° C., even though the eutectic temperature is 363° C. Subsequent heating to 700° C. or higher may result in Vapor Liquid Solid (VLS) growth of quantum studs and wires shown in FIGS. 2 and 9. This may be done using gas assisted epitaxy using $Si_2H_6$ in the MBE machine.

The wafer is coated by oblique evaporation at a small angle of 1 to 5° (or up to 30 degrees in some cases) with an etch resistant (or in certain quantum wire applications "conductive") metal such as Au or Cr, or Al or Be so that the slightly higher (by about 3 Å) ridges are coated preferentially with 6 to 100 Å of the metal relative to the intervening depressions. The wafers are rotated during this process while maintaining the obliquity to improve the uniformity of coverage along the ridges. This rotation also helps to avoid bridging of the metal due to the "lateral needles" that form when evaporating at high obliquity. This rotation may be modified by blocking off the evaporating beam near the sample with a raised barrier along the direction of the quantum ridges so that the evaporation source never is in direct line with the troughs.

The wafers are then removed from the vacuum system and chemically etched in a solution of ethylene diamine (EDA) and water (54 vol % EDA) (or in a 50 wt % solution of KOH:water), so that about 10 Å of Si is removed from the depressions and the metal serves as an etch mask for the ridges. Since the tilted walls of the grooves are near the {111 }, the lateral etching will be markedly slower than the vertical etch. The etching may also be accomplished using directed ion bombardment, or plasma etching. This will lead to deeper grooves without the limitation of one of the slow etching {1 1 1 } planes that may limit the etching depth due to an angle of considerably less than 90 degrees relative to either the (5 5 12) or the (1 1 4) surface. The final result is a Strongly Textured Atomic Surface (STAR) that undulates with an average "wavelength" of the peaks of the ridges of about 18 Å (the average of the 16+22+16 Å sequence on the (5 5 12)). If done on the (1 1 4), the spacing will be 16.3 Å. The Au or Cr (or Be or Al in our first experiments) may then be removed in multiple aqua regia or KCN or other chemical removal steps if desired, for example before passing it on to a MOSFET fabrication cycle. For the MOSFET application the sample is handled like a normal wafer from this point forward, except that the oxidation steps are designed to maintain the STAR surface until the gate dielectric is formed. In a production process, the ridge producing process might also be done only in the gate oxide regions after many of the thick oxide and source and drain implantation and diffusion processes are completed.

EXAMPLE 2

Fabrication Process for Quantum tip Structure

Another embodiment of the quantum structure surface of the present invention is a quantum tip surface. The groove process discussed above in Example 2 is interrupted after the metal is deposited on the quantum ridges, or perhaps after etching the grooves a small amount. The brief etch is designed to leave the metal atomic width "wires" intact along their length, while giving the surface a bit of surface relief which is useful for the next step. In either case, whether the etching step is performed or not, the next step is to use a second single crystal wafer to "cut" the metal "quantum wires". Thus, the second wafer would also have regularly spaced quantum ridges, either a pristine freshly "flashed" surface like the one discussed above (before depositing the metal), or one that has been through the whole STAR groove process above. In the preferred method, the metal (or other material) is removed from the second "atomic-cookie-cutter" wafer before using it to cut the quantum wires on the first wafer. Finally, the first slightly grooved wafer with the quantum wires intact is immersed in a clean HF, or dilute HF (1 to 5%), or a dilute HF:ethanol acid bath.

The second wafer may then be aligned perpendicular (or at some other specified angle to the first substrate )and pressed carefully onto the surface of the first wafer. (This is the "crossed wafer" process mentioned earlier). The wafers are allowed to contact each other without any significant lateral shifting by first contacting the flat bottom edges of the otherwise circular wafers and then letting gravity close them like closing a book. The Van der Waals forces between the two surfaces then finishes the bonding process so that there is absolutely no lateral shifting of the wafers. To ensure that the quantum wires are completely cut, a weight is then placed on the wafer sandwich while still immersed in the solution.

The wafers are then separated while still in the liquid with a thin wedge inserted into the edge of the wafer stack, again being careful that there is no lateral shifting during the separation (debonding) step. The metal coated bottom wafer is then dipped into DI water for 5 minutes and air dried face up to avoid disturbing the quantum dots that result from this treatment. The metal (or other material) need not be completely removed from the regions cut with the second wafer, but the few monolayers MLs of thickness of the quantum wires has been compressed into monolayer thickness regions and squeezed sideways out of the previously continuous quantum wires. This squeezing process is adequate to disrupt the conductivity along the atomic wires and make them into "quantum dots", each of which has dimensions of about 4A X 14A X 20A, where the last number is the approximate thickness of the film and the first 2 numbers are the width and length of the elongated "dots". The most useful thickness range for the q-wire applications is probably between 10 and 30 Å, since below 10 Å the conductivity will be very poor, and above 30 Å the narrow (say 3 to 6 Å width) wires will tend to delaminate from the substrate ridges. On the other hand, as a temporary etch mask, the useful thickness of the deposited material may be as small as 3 Å, which is of the order of one monolayer ML thickness.

The above steps may also be done in $N_2$, Ar, He, or other inactive gas, as well as in Ultra High Vacuum (UHV), etc., although the procedure in HF or the dilute HF, or HF and ethanol leaves the surface in an H-passivated state, which is an advantage for some applications. The dilute HF mixtures are preferred when the quantum ridge metal is either Be or Al.

Thus, each dot in the above case contains about 56 atoms. This number of atoms in a given "dot" is determined from the atomic density of silicon, which is 0.05 atoms/Å$^3$. However, useful dot sizes will span the range from a single channel wall width (3.14 Å) with a single atom thickness (about 4 atoms) to a dot size of about 50×50×40 or 100,000 Å$^3$ (about 5000 atoms). The latter may seem too large to be called a "quantum dot", but it is still several magnitudes smaller than many of the quantum dots reported in the recent literature. For example, 1000×1000×1000, or 1×10$^9$ Å$^3$ (5×10$^7$ atoms) has been shown in proof of principle experiments to have quantum dot properties at temperatures near 1 K. For room temperature operation, the width of the quantum dots are preferably smaller than about 50 Å, which would have a first allowed quantum well energy level of 0.05 eV, which is about 2 kT at 300 K. This magnitude gives the possibility that the thermal energy will not wash out the quantum effects produced by the quantum well. See K. K. Ng, "Complete Guide to Semiconductor Devices", McGraw Hill, N.Y., 1995, pp. 227–228, for the relevant formula, which is $E_n = n^2 K/m_r^* W^2$ where K includes well known physical constants and is 38 eV Å$^2$ when W is in Å, n is an integer, with n=1 for the lowest allowed energy level in the quantum well, and $m_r^*$ is the conductivity effective mass of the carrier relative to the rest mass of the electron, which is 0.26 for the electron and 0.47 for the hole in silicon.

If the "cutting wafer" is the same orientation of the metal coated wafer in the groove, as in the present example, then the dots are separated by an average pitch of about 18 Å in both x and y directions on the (5 5 12), or a spacing of 16.3 Å on the (1 1 4). If the cutting wafer is the (1 1 0), the x-separation will be 5.43 Å, while the y-separation will be the same as before, namely an average of 18 Å or 16.3 Å for the (5 5 12) or the (1 1 4), respectively.

It should be appreciated that all the ranges above refer to Si and must be increased or decreased by up to 30% for other crystals unless otherwise indicated.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A quantum ridge product comprising a substrate having a plurality of substantially parallel quantum ridges on a surface thereof, each pair of adjacent quantum ridges of said plurality of quantum ridges having a pitch of 9.4 to 54 Å and being separated by a groove having a width of 6 to 51 Å and a depth of 4 to 30,000 Å, wherein said quantum ridges are aligned in the <1 1 0>direction, and wherein each of said quantum ridges is straight.

2. The product of claim 1, wherein said at least one groove has a depth of 4 to 3000 Å.

3. The product of claim 1, wherein said substrate comprises a semiconductor material.

4. The product of claim 1, wherein said substrate comprises silicon.

5. The product of claim 1, wherein said substrate comprises a group III–V semiconductor.

6. The product of claim 1, wherein said substrate comprises GaAs.

7. The product of claim 1, wherein said substrate has a (1 1 4) surface structure.

8. The product of claim 1, wherein said substrate has a (5 5 12) surface structure.

9. The product of claim 1, further comprising an organic molecule located in at least one of said grooves.

10. The product of claim 1, further comprising a fullerene tube located in at least one of said grooves.

11. The product of claim 1, further comprising at least one fullerene ball at least partially filling at least one of said grooves.

12. The product of claim 1, wherein said at least one quantum ridge is located in a depression of said substrate.

13. The product of claim 1, wherein said at least one quantum ridge is located within a convex region of said substrate.

14. The product of claim 1, wherein said at least one quantum ridge includes a material deposited on said quantum ridge by a vapor liquid solid growth technique.

15. A quantum ridge product comprising: a substrate having a plurality of substantially parallel quantum ridges on a surface thereof, each pair of adjacent quantum ridges of said plurality of quantum ridges having a pitch of 9.4 to 54 Å and being separated by a groove having a width of 6 to 51 Å and a depth of 4 to 30,000 Å least one of said quantum ridges having a quantum wire supported on top of said at least one quantum ridge and extending in a direction along the length of said quantum ridge, said quantum wire comprising a conductive material, wherein said quantum ridges are aligned in the <1 1 0> direction, and wherein each of said quantum ridges is straight.

16. The product of claim 15, wherein said quantum wire has a thickness of about 6 Å to 30,000 Å.

17. The product of claim 15, wherein said at least one groove has a depth of 4 Å to 3000 Å.

18. The product of claim 15, wherein said at least one quantum ridge having a quantum wire supported thereon comprises at least two quantum ridges and each of said quantum ridges has a respective quantum wire supported on top thereof and extending in a direction along the length thereof.

19. The product of claim 15, wherein said substrate comprises a semiconductor material.

20. The product of claim 15, wherein said substrate comprises silicon.

21. The product of claim 15, wherein said substrate comprises a group III–V semiconductor.

22. The product of claim 15, wherein said substrate comprises GaAs.

23. The product of claim 15, wherein said quantum wire is comprised of a metal.

24. The product of claim 15, further comprising a larger band gap material which covers at least a portion of said quantum wire, said larger band gap material having larger band gap than said quantum wire.

25. The product of claim 24, wherein said larger band gap material comprises silicon dioxide.

26. The product of claim 24, wherein said larger band gap material comprises silicon nitride.

27. The product of claim 24, wherein said larger band gap material comprises diamond-like carbon.

28. The product of claim 15, wherein said substrate has a (1 1 4) surface structure.

29. The product of claim 15, wherein said substrate has a (5 5 12) surface structure.

30. The product of claim 15, wherein said plurality of quantum ridges are located in a depression of said substrate.

31. The product of claim 15, wherein said plurality of quantum ridges are located within a convex region of said substrate.

32. The product of claim 15, wherein at least one quantum ridge of said plurality of quantum ridges includes a material deposited on said at least one quantum ridge by a vapor liquid solid growth technique.

33. A quantum tip product comprising a substrate having a plurality of quantum tips on a surface thereof, each of said plurality of quantum tips having a pitch of 9.4 to 54 Å in first direction and being separated from adjacent quantum tips by grooves having a width of 6 to 51 Å in said first direction and a depth of 4 to 30,000 Å, wherein said quantum tips are arranged in rows aligned in a straight line in the <1 1 0> direction.

34. The product of claim 33, wherein each of said grooves has a width of 6 Å to 51 Å and a depth of 4 Å to 3,000 Å.

35. The product of claim 33, wherein each of said quantum tips is separated from a first set of two of said adjacent quantum tips in said first direction by a first pair of substantially parallel grooves and is separated from a second set of two of said adjacent quantum tips in a second direction by a second pair of substantially parallel grooves, said first and said second direction being perpendicular to each other.

36. The product of claim 35, wherein each said adjacent pair of said plurality of quantum tips has a pitch of 9.4 to 54 Å said first and said second direction.

37. The product of claim 33, wherein said substrate comprises a semiconductor material.

38. The product of claim 33, wherein said substrate comprises silicon.

39. The product of claim 33, wherein said substrate comprises a group III–V semiconductor.

40. The product of claim 33, wherein said substrate comprises GaAs.

41. The product of claim 33, wherein said substrate has a (1 1 4) surface structure.

42. The product of claim 33, wherein said substrate has a (5 5 12) surface structure.

43. The product of claim 33, further comprising a fullerene tube located in at least one of said grooves.

44. The product of claim 33, further comprising a plurality of fullerene balls at least partially filling at least one of said grooves.

45. The product of claim 33, wherein said plurality of quantum tips are located in a depression of said substrate.

46. The product of claim 33, wherein said plurality of quantum tips are located within a convex region of said substrate.

47. The product of claim 33, wherein at least one quantum tip of said plurality of quantum tips includes a material deposited on said at least one quantum tip by a vapor liquid solid growth technique.

48. A quantum tip product comprising a substrate having a plurality of quantum tips on a surface thereof, each of said plurality of quantum tips having a pitch of 9.4 to 54 Å in a first direction and being separated from adjacent quantum tips by grooves having a width of 6 Å to 51 Å and a depth of 4 to 30,000 Å, wherein said quantum tips are arranged in rows aligned in a straight line in the <1 1 0> direction, and wherein at least one of said quantum tips has a quantum dot supported on top of said at least one quantum tip, said quantum dot comprising a conductive material having a width of 3 Å to 47 Å.

49. The product of claim 48, wherein said quantum dot has a thickness of about 6 Å to 30,000 Å.

50. The product of claim 48, wherein each of said grooves has a depth of 4 Å to 3000 Å.

51. The product of claim 48, wherein each of said quantum tips is separated from a first set of two of said adjacent quantum tips in said first direction by a first pair of substantially parallel grooves and is separated from a second set of two of said adjacent quantum tips in a second direction by a second pair of substantially parallel grooves, said first direction and said second direction being perpendicular to each other.

52. The product of claim 51, wherein each said adjacent pair of said plurality quantum tips has a pitch of 9.4 Å to 54 Å said first and in said second direction.

53. The product of claim 48, wherein said substrate comprises a semiconductor material.

54. The product of claim 48, wherein said substrate comprises silicon.

55. The product of claim 48, wherein said substrate comprises a group III–V semiconductor.

56. The product of claim 48, wherein said substrate comprises GaAs.

57. The product of claim 48, wherein said quantum dot is comprised of a metal.

58. The product of claim 48, further comprising a larger band gap material which covers at least a portion of said quantum dot, said larger band gap material having larger band gap than said quantum dot.

59. The product of claim 58, wherein said larger band gap material comprises silicon dioxide.

60. The product of claim 58, wherein said larger band gap material comprises silicon nitride.

61. The product of claim 58, wherein said larger band gap material comprises diamond-like carbon.

62. The product of claim 48, wherein said substrate has a (1 1 4) surface structure.

63. The product of claim 48, wherein said substrate has a (5 5 12) surface structure.

64. The product of claim 48, wherein said plurality of quantum tips are located in a depression of said substrate.

65. The product of claim 48, wherein said plurality of quantum tips are located within a convex region of said substrate.

66. The product of claim 48, wherein at least one quantum tip of said plurality of quantum tips includes a material deposited on said at least one quantum tip by a vapor liquid solid growth technique.

67. A method for making a quantum structure product comprising the steps of:
providing a first substrate having a (1 1 X) surface structure and including a plurality of substantially parallel quantum ridges, and grooves on a surface thereof, each of said grooves having a width of 6 to 51 Å and depth of 4 to 30,000 Å and separating adjacent quantum ridges, each pair of adjacent quantum ridges of said plurality of quantum ridges having a pitch of 9.4 to 54 Å, each of said quantum ridges being straight and aligned in the <1 1 0> direction; and
coating the first substrate with a metal to form at least one quantum wire on at least one of the quantum ridges.

68. The method of claim 67, wherein said substrate is formed by the following steps:
heating pre-substrate having a (1 1 X) surface structure to remove surface oxides; and
cooling the pre-substrate to about −20° C. to 900° C. to form the first substrate.

69. The method of claim 68, wherein said heating step comprises heating said pre-substrate using a beam-expanded laser.

70. The method of claim 67, wherein said first substrate is formed by the following steps:
heating a pre-substrate comprising Si having a (1 1 X) surface structure at a pressure of $10^{-10}$ torr and about 1150° C. to remove surface oxides; and
cooling the pre-substrate to about 1° K to 253° K to form the first substrate.

71. The method of claim 67, wherein the quantum wire comprises a conductive material.

72. The method of claim 67, further comprising at least partially covering the quantum wire with a larger band gap material, the larger band gap material having larger band gap than said quantum wire.

73. The method of claim 72, wherein said larger band gap material comprises silicon dioxide.

74. The method of claim 72, wherein said larger band gap material comprises silicon nitride.

75. The method of claim 72, wherein said larger band gap material comprises diamond-like carbon.

76. The method of claim 67, wherein the at least one quantum wire is deposited on the at least one quantum ridge by oblique evaporation of quantum wire material onto the first substrate at an angle of 1° to 30°.

77. The method of claim 67, wherein the quantum wire comprises a material resistant to an etching solution and said method further comprises the step of etching said grooves on said first substrate to a depth of 4 Å to 3,000 Å.

78. The method of claim 67, further comprising the step of removing the quantum wires.

79. The method of claim 67, further comprising the step of inactivating portions of the at least one quantum wire to form quantum dots.

80. The method of claim 79, further comprising the step of at least partially covering the quantum dots with a larger band gap material, the larger band gap material having larger band gap than said quantum wire.

81. The method of claim 80, wherein said larger band gap material comprises silicon dioxide.

82. The method of claim 80, wherein said larger band gap material comprises silicon nitride.

83. The method of claim 80, wherein said larger band gap material comprises diamond-like carbon.

84. The method of claim 67, wherein portions of the at least one quantum wire are removed by pressing second substrate having a plurality of substantially parallel quantum ridges on the surface thereof against the first substrate.

85. The method of claim 84, wherein the second substrate is pressed against the first substrate so that the quantum ridges on the second substrate are oriented at a right angle to the quantum ridges on the second substrate.

86. The method of claim 67, further comprising the step of inactivating portions of the at least one quantum wire to form quantum dots.

87. The method of claim 86, wherein portions of the at least one quantum wire are removed by pressing second substrate having a plurality of substantially parallel quantum ridges on the surface thereof against the first substrate.

88. The method of claim 87, wherein the second substrate is pressed against the first substrate so that the quantum ridges on the second substrate are oriented at a right angles to the quantum ridges on the second substrate.

89. The method of claim 86, wherein the at least one quantum wire comprises a conductive material.

90. The method of claim 86, further comprising the step of at least partially covering the quantum dots with a larger band gap material, the larger band gap material having larger band gap than said quantum dots.

91. The method of claim 90, wherein said larger band gap material comprises silicon dioxide.

92. The method of claim 91, wherein said larger band gap material comprises silicon nitride.

93. The method of claim 91, wherein said larger band gap material comprises diamond-like carbon.

94. A quantum ridge product comprising two quantum ridge substrates bonded to each other, each of said substrates having a plurality of substantially parallel quantum ridges on a surface thereof, each pair of adjacent quantum ridges of said plurality quantum ridge having a pitch of 9.4 to 54 Å and being separated by a groove having a width of 6 to 51 Å and a depth of 4 Å to 30,000 Å, wherein said quantum ridges are aligned in the <1 1 0> direction and wherein each of said quantum ridges is straight said quantum ridge substrates being bonded together at the quantum ridge surface of each substrate.

95. The quantum ridge product of claim 94, wherein said product includes quantum dots supported on said ridges of at least one of said substrates.

96. The quantum ridge product of claim 94, wherein said quantum ridges on one of said two substrates are substantially parallel to the quantum ridges on the second of said two substrates.

97. The quantum ridge product of claim 94, wherein said quantum ridges on one of said two substrates are substantially perpendicular to the quantum ridges on a second said two substrates.

98. A quantum ridge product comprising: a substrate having a plurality of substantially parallel quantum ridges on a surface thereof, each pair of adjacent quantum ridges of said plurality quantum ridge having a pitch of 9.4 to 54 Å and being separated by a groove having a width of 6 to 51 Å and a depth of 4 to 30,000 Å, at least one of said quantum ridges having a quantum dot supported on top of said at least one quantum ridge, said quantum dot comprising a conductive material having a width in at least one direction of 3 Å to 47 Å, wherein said quantum ridges are aligned in the <1 1 0> direction, and wherein each of said quantum ridges is straight.

99. The product of claim 98, wherein said quantum dot has a thickness of about 6 Å to 30,000 Å.

100. The product of claim 98, wherein said at least one quantum ridge having a quantum dot supported thereon comprises at least two quantum ridges and each of said quantum ridges has a respective quantum dot supported on top thereof.

101. The product of claim 98, wherein said substrate comprises a semiconductor material.

102. The product of claim 98, wherein said substrate comprises silicon.

103. The product of claim 98, wherein said substrate comprises a group III–V semiconductor.

104. The product of claim 98, wherein said substrate comprises GaAs.

105. The product of claim 98, wherein said quantum dot comprises is comprised of a metal.

106. The product of claim 98, further comprising a larger band gap material which covers at least a portion of said quantum dot, said larger band gap material having larger band gap than said quantum dot.

107. The product of claim 106, wherein said larger band gap material comprises silicon dioxide.

108. The product of claim 106, wherein said larger band gap material comprises silicon nitride.

109. The product of claim 106, wherein said larger band gap material comprises diamond-like carbon.

110. The product of claim 98, wherein said substrate has a (1 1 4) surface structure.

111. The product of claim 98, wherein said substrate has a (5 5 12) surface structure.

112. The product of claim 98, wherein said plurality of quantum ridges are located in a depression of said substrate.

113. The product of claim 98, wherein said plurality of quantum ridges are located within a convex region of said substrate.

114. The product of claim 98, wherein at least one quantum ridge of said plurality of quantum ridges includes a material deposited on said at least one quantum ridge by a vapor liquid solid growth technique.

115. A quantum ridge product comprising a substrate having a plurality of substantially parallel quantum ridges on a surface thereof, each pair of adjacent quantum ridges of said plurality of quantum ridges having a pitch of 9.4 to 54 Å and being separated by a groove having a width of 6 to 51 Å, wherein said grooves have an average depth of 4 to 30,000 Å, wherein said quantum ridges are aligned in the <1 1 0> direction, and wherein each of said quantum ridges is straight.

* * * * *